United States Patent
Yasui et al.

(10) Patent No.: US 10,667,448 B2
(45) Date of Patent: May 26, 2020

(54) ELECTRONIC COMPONENT MOUNTING METHOD

(71) Applicant: FUJI CORPORATION, Chiryu (JP)

(72) Inventors: Yoshihiro Yasui, Nagoya (JP); Marie Terazawa, Kariya (JP)

(73) Assignee: FUJI CORPORATION, Chiryu (JP)

( * ) Notice: Subject to any disclaimer, the term of this patent is extended or adjusted under 35 U.S.C. 154(b) by 439 days.

(21) Appl. No.: 15/319,236

(22) PCT Filed: Jun. 17, 2014

(86) PCT No.: PCT/JP2014/066063
§ 371 (c)(1),
(2) Date: Dec. 15, 2016

(87) PCT Pub. No.: WO2015/193975
PCT Pub. Date: Dec. 23, 2015

(65) Prior Publication Data
US 2017/0127582 A1    May 4, 2017

(51) Int. Cl.
H05K 13/04    (2006.01)
H05K 13/08    (2006.01)
H05K 3/30     (2006.01)

(52) U.S. Cl.
CPC .......... H05K 13/0404 (2013.01); H05K 3/30 (2013.01); H05K 3/303 (2013.01);
(Continued)

(58) Field of Classification Search
CPC .......... H05K 13/0404; H05K 13/0417; H05K 13/0452; H05K 13/0478; H05K 13/08;
(Continued)

(56) References Cited

U.S. PATENT DOCUMENTS 6,618,935 B1 * 9/2003 Schindler ........... H05K 13/0452
29/832
2007/0130756 A1 * 6/2007 Watanabe .......... H05K 13/0417
29/743
(Continued)

FOREIGN PATENT DOCUMENTS

CN    102469759 A    5/2012
DE    10 2009 042 651 A1    3/2011
(Continued)

OTHER PUBLICATIONS

English translation of the Japanese Office Action dated Aug. 29, 2018 in Patent Application No. 2016-528695.
(Continued)

Primary Examiner — A. Dexter Tugbang
(74) Attorney, Agent, or Firm — Oblon, McClelland, Maier & Neustadt, L.L.P.

(57) ABSTRACT

An electronic component mounting method for mounting a first board and a second board including, mounting a first set of electronic components on the first board allocated to first mounting heads; and mounting a second set of electronic components on the second board allocated to the second mounting heads and to the first mounting heads and the second mounting heads of the second lane dedicated mounters. By this, the mounting load is spread evenly across all the mounting heads, thus the idle time of mounting heads is reduced, improving the operating rate, meaning that panels are produced efficiently by the electronic component mounting method.

6 Claims, 5 Drawing Sheets

(52) U.S. Cl.
CPC ..... *H05K 13/0417* (2013.01); *H05K 13/0452* (2013.01); *H05K 13/0478* (2013.01); *H05K 13/08* (2013.01); *H05K 13/084* (2018.08); *H05K 13/085* (2018.08); *Y10T 29/49133* (2015.01); *Y10T 29/49137* (2015.01); *Y10T 29/53174* (2015.01); *Y10T 29/53178* (2015.01); *Y10T 29/53187* (2015.01)

(58) Field of Classification Search
CPC ...... H05K 13/084; H05K 13/085; H05K 3/30; H05K 3/303; Y10T 29/53174; Y10T 29/53178; Y10T 29/53187; Y10T 29/49133; Y10T 29/49137
See application file for complete search history.

(56) References Cited

U.S. PATENT DOCUMENTS

| | | | |
|---|---|---|---|
| 2010/0175246 A1* | 7/2010 | Nagao | H05K 13/0452 29/829 |
| 2010/0249971 A1 | 9/2010 | Maenishi et al. | |
| 2010/0325860 A1* | 12/2010 | Maenishi | H05K 13/085 29/407.01 |
| 2011/0197775 A1 | 8/2011 | Nagao | |

FOREIGN PATENT DOCUMENTS

| | | | |
|---|---|---|---|
| JP | 2009-231808 A | | 10/2009 |
| JP | 2009-231812 A | | 10/2009 |
| JP | 2009-239257 A | | 10/2009 |
| JP | 2012-99654 A | | 5/2012 |
| JP | 4978398 B2 | | 7/2012 |
| JP | 2012-160592 A | | 8/2012 |
| JP | 2014-103317 A | | 6/2014 |
| JP | 2017059615 A | * | 3/2017 |
| WO | WO 2009/060705 A1 | | 5/2009 |
| WO | WO 2009/104384 A2 | | 8/2009 |
| WO | Wo 2009/104384 A3 | | 8/2009 |

OTHER PUBLICATIONS

Extended European Search Report dated Jun. 26, 2017 in Patent Application No. 14895031.4.
International Search Report dated Sep. 22, 2014, in PCT/JP2014/066063 filed Jun. 17, 2014.
Office Action dated Apr. 26, 2018 in Japanese Patent Application No. 2016-528695 English translation only, 4 pages.

* cited by examiner

ELECTRONIC COMPONENT MOUNTING METHOD

TECHNICAL FIELD

The present application relates to an electronic component mounting method used by an electronic component mounting system configured from multiple connected component mounters equipped with dual conveyance lanes and twin mounting heads.

BACKGROUND ART

Equipment such as solder printers, component mounters, reflow ovens, and board inspection machines is used to produce boards mounted with many electronic components. Conventionally, this equipment is connected to configure a board production line that acts as an electronic component mounting system. Among this equipment, component mounters provided with a board conveyance device that includes a conveyance lane for loading and unloading boards, and a component transfer device including a mounting head that picks up electronic components from a component supply device and mounts them on a board are typical. In order to support an increase in the types of electronic components mounted on a single board, electronic component mounting system configured from multiple connected component mounters are common. Further, in order to produce two types of boards in parallel, there are also electronic component mounting system configured from multiple connected component mounters equipped with dual conveyance lanes and twin mounting heads. With electronic component mounting systems that produce two types of boards in parallel, an independent production method and a dual production method are already known.

With an independent production method, a first board loaded into a first conveyance lane is mounted with electronic components using a first mounting head, and a second board loaded into a second conveyance lane is mounted with electronic components using a second mounting head. Thus, operators are able to handle the first conveyance lane and the second conveyance lane as separate independent board production lines. In other words, this allows for the production speeds of the boards to be different for the first conveyance lane and the second conveyance lane. Also, when the type of board being produced changes, operators are able to perform changeover work for each conveyance lane independently.

Conversely, with a dual production method, first, electronic components are mounted onto a first board loaded into a first conveyance lane using a first mounting head and a second mounting head, during which time a second board is loaded into a second lane. When mounting onto the first board is complete, electronic components are mounted onto the second board loaded into the second conveyance lane using the first mounting head and the second mounting head, during which time the completed first board is unloaded from the first conveyance lane and the next board is loaded. Thereafter, mounting is performed using the first mounting head and the second mounting head alternately at the first conveyance lane and the second conveyance lane.

The two production methods above each have advantages and disadvantages. For example, an independent production method has an advantage in that it is possible to perform changeover work at the second conveyance lane while the first board is being produced at the first conveyance lane. On the other hand, an independent production method has a disadvantage in that the mounting heads are idle in a standby state when boards are being loaded into each conveyance lane. Conversely, a dual production method has an advantage in that mounting heads are not in a standby state while boards are being loaded and unloaded. On the other hand, a dual production method has disadvantages in that the production speeds of the first board and the second board cannot be changed, and complex control is required to prevent the mounting heads from interfering with each other, with mounting heads needing to be in a standby state in order to avoid interference. Due to the above, it is desirable to use the more efficient production method considering conditions such as the type of board, production quantity, and effort required for changeover work. Technology for improving a production method in order to improve board production efficiency of an electronic component system equipped with dual conveyance lanes and twin heads is disclosed in patent literature 1 and 2.

Disclosed in patent literature 1 is a component mounting system provided with multiple component mounting devices lined up, the component mounting devices being provided with a board conveyance conveyor configured from a board conveyance path along which multiple types of boards are conveyed, and multiple component mounting means that perform consecutive mounting of components onto multiple types of boards. Each component mounting device of this component mounting system provided with multiple component mounting means performs component mounting operations with respect to one type of board, with each board conveyance path being established such that each type of board is conveyed separately. Further, in the embodiment disclosed in FIG. 1 of patent literature 1, from the six component mounters lined up, the first mounter and the fourth mounter are dedicated for board $3a$ of board conveyance path La, the second mounter and the fifth mounter are dedicated for board $3b$ of board conveyance path Lb, and the third mounter and the sixth mounter are dedicated for board $3c$ of board conveyance path Lc. Due to this, each component mounting device provided with multiple component mounting means only performs component mounting for one type of board, thus mounting mistakes are unlikely to occur, meaning that the good product production rate is improved compared to previous technology.

Patent literature 2 discloses a mounting conditions determining method for determining mounting conditions at a production line provided with multiple component mounters that each include multiple conveyance lanes. This mounting conditions determining method includes a step for allocating board types to each set of conveyance lanes formed from a series of paths, a setting step for setting each of the multiple component mounters as a dedicated device that performs mounting for only one type of board, and a step for determining the quantity of dedicated devices and the quantity of shared devices by changing multiple dedicated devices for at least one shared device. Further, in the embodiment shown in FIGS. 14 and 15 of patent literature 2, from the six connected component mounters, the first mounter and second mounter are dedicated for the R lane, the third mounter and fourth mounter are dedicated mounters for the F lane, and the fifth mounter dedicated for the R lane and the sixth mounter dedicated for the F lane are changed for a single shared device. Thus, it is possible to maintain a high maximum operating rate for all the component mounters while limiting the arrangement space required for the mounters, and maximize the quantity of dedicated mounters that have excellent changeover functionality, while limiting the overall quantity of component mounters.

CITATION LIST

Patent Literature

Patent Literature 1: JP-4978398
Patent literature 2: JP-A-2009-231812

BRIEF SUMMARY

Problem to be Solved

However, there are cases of production in which electronic components are mounted on the top surface and bottom surface of a double-sided board using the two conveyance lanes of the above electronic component mounting system. In this case, because the production quantity of the top side and the bottom side are the same, it is possible to use a conventional dual production method, however, there are cases in which the standby time of mounting heads is long in order to avoid interference between mounting heads, meaning that production is not efficient. Also, a conventional independent production method may be used for double-sided production, but often many components are to be mounted on the top surface while few components are to be mounted on the bottom surface, leading to a large difference in time required for mounting, making efficient production difficult.

Also, there are cases in which it is desirable for the production completion periods to be similar even for production of two types of unrelated boards with a different production quantity produced using two conveyance lanes of an electronic component mounting system. In this case, an independent production method in which the production speed for the two conveyance lanes is different is desirable. However, with a conventional independent production method, it is not necessarily the case that the production speeds for boards in the two conveyance lanes are in exact proportion to the production quantities. Therefore, cases arise in which, on the side where the amount of work of mounting electronic components is low, that is, the side where the mounting load is light, the conveyance lane and mounting head become idle, meaning that production efficiency is not good.

Considering the above problems with the background art, an object of the present application is to provide an electronic component mounting method and electronic component mounting system in which boards are produced with good efficiency on two conveyance lanes using an independent production method in a case in which there is a difference in the quantity of components on two types of boards, a case in which there is a difference in the production quantity of the two boards, or the like.

Means for Solving the Problem

To solve the above problems, the electronic component mounting method according to an aspect of the present application includes: setting a portion of multiple electronic component mounters as independent production mounters and the remaining portion of the multiple electronic component mounters as second lane dedicated mounters; allocating mounting of a first set of electronic components on a first board to a first mounting head of the independent production mounters; and allocating mounting of a second set of electronic components on a second board to a second mounting head of the independent production mounters and to a first mounting head and a second mounting head of the second lane dedicated mounters, the electronic component mounting method being a method in which at least one of the component quantity or the component types are different for the first set of electronic components to be mounted on the first board and the second set of electronic components to be mounted on the second board, and using an electronic component mounting system in which multiple component mounters are arranged in series with respective first conveyance lanes of the component mounters connected in series and respective second conveyance lanes of the component mounters connected in series, the component mounters being equipped with a board conveyance device having a first conveyance lane that loads and unloads a first board and a second conveyance lane that loads and unloads a second board, and a board transfer device having a first mounting head, provided adjacent to the first conveyance lane, that is capable of movement and of mounting electronic components on the first board loaded on the first conveyance lane and of mounting electronic components on the second board loaded on the second conveyance lane, and a second mounting head, provided adjacent to the second conveyance lane, that is capable of movement and of mounting electronic components on the first board loaded on the first conveyance lane and of mounting electronic components on the second board loaded on the second conveyance lane.

Effects

With the electronic component mounting method according to claim 1, considering the component quantities and production quantities of two types of boards, a first board for which the mounting load is light is produced at a first conveyance lane, and a second board for which the mounting load is heavy is produced at a second conveyance lane. Note that first and second boards, and first and second conveyance lanes, are given the prefixes "first" and "second" in this manner merely to distinguish the items from each other; this labeling is purely arbitrary. Also, mounting of a first set of electronic components on the first board for which the mounting load is light is allocated to the first mounting heads of the independent production mounters, and mounting of a second set of electronic components on the second board for which the mounting load is heavy is allocated to the second mounting heads of the independent production mounters and to the first mounting heads and the second mounting heads of the second lane dedicated mounters.

In other words, mounting for the first board for which the mounting load is light is allocated to the first mounting heads of only a portion of the multiple component mounters, that is, to a smaller number of mounting heads. Conversely, mounting for the second board for which the mounting load is heavy is allocated to the first mounting heads of the remaining portion of the multiple component mounters, and to the second mounting heads of all of the component mounters, that is, to a larger number of mounting heads. Also, because the production speeds of the first conveyance lane and the second conveyance lane may be different, the present disclosure can be considered as an improved independent production method. With the present disclosure, at least one of the first mounting heads on the first conveyance lane side for which there is tendency for idle time to occur with conventional independent conveyance methods is allocated to the second conveyance lane, thus the mounting load is allocated evenly across all the mounting heads. By this, the idle time of mounting heads is reduced, improving the operating rate, meaning that panels are produced efficiently by the electronic component mounting system.

DESCRIPTION OF EMBODIMENTS

Figure 1:
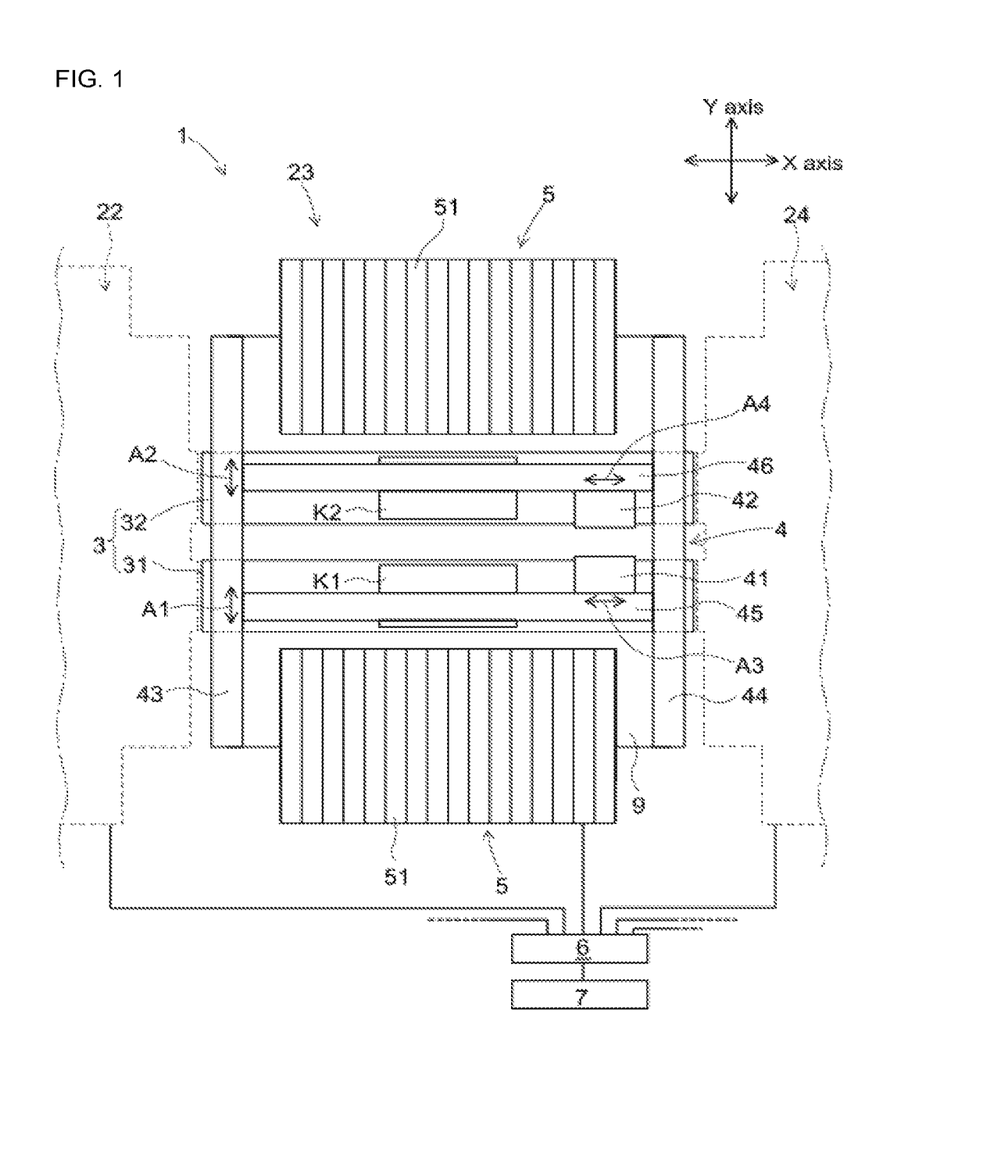
FIG. 1 is a plan view for illustrating the configuration of an electronic component mounting system, which is an embodiment of the present disclosure.

First, electronic component mounting system 1, which is an embodiment of the present disclosure, is described with reference to FIG. 1. FIG. 1 is a plan view for illustrating the configuration of electronic component mounting system 1, which is an embodiment of the present disclosure. Electronic component mounting system 1 uses an embodiment of an electronic component mounting method described later on. Electronic component mounting system 1 is configured from six machines, component mounters 21 to 26, that have the same configuration. In FIG. 1, details of component mounter 23, arranged as the third mounter from the upstream side, are shown, with outlines of the second and fourth mounters, component mounters 22 and 24, shown simply by dashed lines. Each of the component mounters 21 to 26 are types with dual conveyance lanes and twin mounting heads, capable of producing two types of boards, K1 and K2, in parallel. Component mounters 21 to 26 are configured from board conveyance device 3, component transfer device 4, component supply device 5, and so on assembled on base 9.

Board conveyance device 3 is provided near the center of component mounters 21 to 26 in the lengthwise direction (Y-axis direction). Board conveyance device 3 is a so-called dual-conveyance lane type device provided with first conveyance lane 31 and second conveyance lane 32, which are parallel to each other. First board K1 is loaded into first conveyance lane 31 and stopped at a component mounting position; then, first board K1 is unloaded after electronic components have been mounted. The first conveyance lanes 31 of the six component mounters 21 to 26 are connected in series and first board K1 is conveyed through each mounter in order. Similarly, second board K2 is loaded into second conveyance lane 32 and stopped at a component mounting position; then, second board K2 is unloaded after electronic components have been mounted. The second conveyance lanes 32 of the six component mounters 21 to 26 are also connected in series and second board K2 is conveyed through each mounter in order.

First conveyance lane 31 and second conveyance lane 32 have substantially the same construction, so descriptions are given mainly regarding first conveyance lane 31. Although not shown in FIG. 1, first conveyance lane 31 is configured from a pair of guide rails, a pair of conveyor belts, and so on. The pair of guide rails extend parallel to each other in the X-axis direction on base 9. The pair of conveyor belts are each guided by the guide rails and move with first board K1 loaded on them. First conveyance lane 31 is provided with a clamp device that positions first board K1 at a component mounting position provided near the middle of the conveyance lane.

Component transfer device 4 is a twin mounting head type device that holds mounting heads 41 and 42 and is able to move in the X-axis direction and Y-axis direction. Component transfer device 4 is configured from mounting heads 41 and 42, pair of fixed rails 43 and 44, two head movement rails 45 and 46, a servo motor, which is not shown, and so on. The pair of fixed rails 43 and 44 are provided intersecting with first conveyance lane 31 and second conveyance lane 32 above board conveyance device 3. The pair of fixed rails 43 and 44 are provided spaced apart from and parallel to each other. First movement rail 45 and second movement rail 46 span between the pair of fixed rails 43 and 44, and are able to move in the Y-axis direction (shown by arrows A1 and A2 in FIG. 1) along fixed rails 43 and 44. First mounting head 41 is supported on first movement rail 45 and is movable in the X-axis direction (shown by arrow A3 in FIG. 1). Second mounting head 42 is supported on second movement rail 46 and is movable in the X-axis direction (shown by arrow A4 in FIG. 1). Y-axis direction movement of first movement rail 45 and second movement rail 46, and X-axis direction movement of first mounting head 41 and second mounting head 42 are each independently driven by separate servo motors.

First mounting head 41 is provided adjacent to first conveyance lane 31 to be capable of movement, and is capable of mounting electronic components on first board K1 on first conveyance lane 31 and on second board K2 on second conveyance lane 32. Similarly, second mounting head 42 is provided adjacent to second conveyance lane 32 to be capable of movement, and is capable of mounting electronic components on first board K1 on first conveyance lane 31 and on second board K2 on second conveyance lane 32. However, in order that the two mounting heads 41 and 42 do not collide into each other, control is performed such that there is no interference.

Component supply device 5 is provided at the front and rear in the lengthwise direction of component mounter 2. Component supply device 5 is configured such that multiple tape-type feeders 51 are loadable side by side. Component supply device 5 is not restricted to this and may be configured from a tray-type feeder, or a mixture of tape-type feeders 51 and a tray-type feeder. Component supply device 5 at the bottom in FIG. 1 supplies electronic components to first mounting head 41, and component supply device 5 at the top in FIG. 1 supplies electronic components to second mounting head 42.

Each component mounter 21 to 26 is controlled from system control section 6, which is connected via a communication line. A solder printer and solder inspection machine, which are not shown, are provided on the upstream side of electronic component mounting system 1 configured from six component mounters 21 to 26, and a board inspection machine and reflow oven are provided on the downstream side, thus configuring a board production line. Host computer 7 that controls the entire board production line cooperates with system control section 6. The electronic component mounting method of the present embodiment is performed by control of system control section 6, host computer 7, or a combination system control section 6 and host computer 7. Hereinafter, the portion controlling the electronic component mounting method of the present embodiment is referred to simply as the control section.

The electronic component mounting method of the present embodiment will be described. The electronic component mounting method of the present embodiment is performed when at least one of the component quantity or the component types are different between a first set of electronic components to be mounted on first board K1 to be produced at electronic component mounting system 1 and a second set of electronic components to be mounted on second board K2 to be produced at electronic component mounting system 1. That is, the electronic component mounting method of the present embodiment is performed when the types of the first board and the second board are different. Also, a first production quantity N1, which is the quantity of first boards K1 to be produced, and a second production quantity N2, which is the quantity of second boards K2 to be produced, are determined in advance.

As a combination of first board K1 and second board K2, for example, one may consider the combination of the bottom surface and the top surface of a double-sided board. Electronic component mounting system 1 handles the top side and the bottom side of the double-sided board internally as boards of a different type to each other. Regarding the quantity of electronic components to be mounted on the double-sided board, many components are to be mounted on the top surface and few component are to be mounted on the bottom surface. Further, usually, the production quantity is the same for the top surface and the bottom surface of a double-sided board.

Also, for example, there are cases in which one first board K1 and two second boards K2 are combined as a set to make one final product. In this case, the production quantity of first board K1 will be half the production quantity of second board K2. However, the size relationship of the component quantity is uncertain for the first set of electronic components to be mounted on first board K1 and the second set of electronic components to be mounted on second board K2.

Without being limited to the above two examples, the control section considers the component quantities and production quantities of two types of boards, and determines to produce first board K1 for which the mounting load is light at first conveyance lane 31, and to produce second board K2 for which the mounting load is heavy at second conveyance lane K2. Note that first and second boards K1 and K2, and first and second conveyance lanes 31 and 32 are given the prefixes "first" and "second" merely to distinguish the items from each other; this labeling is purely arbitrary. Thus, although first conveyance lane 31 and first mounting head 41 are arranged at the bottom of FIG. 1 and second conveyance lane 32 and second mounting head 42 are arranged at the top of FIG. 1, the labels "first" and "second" may be switched.

The control section sets a portion of the six component mounters 21 to 26 as independent production mounters 2D, and sets the remaining portion as second lane dedicated mounters 2S. With independent production mounters 2D, electronic components are mounted on first board K1 on first conveyance lane 31 using first mounting head 41, and electronic components are mounted on second board K2 on second conveyance lane 32 using second mounting head 42. Conversely, with second lane dedicated mounters 2S, first board K1 is passed through first conveyance lane 31, and electronic components are mounted on second board K2 on second conveyance lane 32 using first mounting head 41 and second mounting head 42. That is, with second lane dedicated mounter 2S, first mounting head 41 is allocated to help at second conveyance lane 32.

Control section has a control target to match first production required time T1, which is a time estimated to be required for the production of first production quantity N1 of first boards K1, and second production required time T2, which is a time estimated to be required for the production of second production quantity N2 of second boards K2. To realize the control target, the control section appropriately allocates the six component mounters 21 to 26 as independent production mounters 2D and second lane dedicated mounters 2S.

Further, the control section appropriately allocates the first set of electronic components to first mounting heads 41 of independent production mounters 2D. By this, each first individual machine cycle time CT1 of each independent production mounter 2D is balanced to be approximately the same. Note that, first individual machine cycle time CT1 includes mounting time and conveyance time. Mounting time is the time required to mount electronic components allocated to first mounting head 41 of each independent production mounter 2D on first board K1. Conveyance time is the sum of the time for loading and positioning of first board K1 by each first conveyance lane 31 of independent production mounter 2D before component mounting, and the time for unloading following release of first board K1 after component mounting.

Similarly, the control section appropriately allocates the second set of electronic components to second mounting 42 of independent production mounter 2D, and first mounting head 41 and second mounting head 42 of second lane dedicated mounter 2S. By this, each second individual machine cycle time CT2 of each component mounter 21 to 26 is balanced to be approximately the same. Second individual machine cycle time CT2, similar to first individual machine cycle time CT1, includes mounting time and conveyance time. Mounting time is the time required to mount electronic components allocated to second mounting head 42 of each independent production mounter 2D on second board K2, and the time required to mount electronic components allocated to first mounting head 41 and second mounting head 42 of each second lane dedicated mounters 2S on second board K2. Also, conveyance time is the sum of the time for loading and positioning of second board K2 by each second conveyance lane 32 of the six component mounters 21 to 26 before component mounting, and the time for unloading following release of second board K2 after component mounting.

Figure 2:
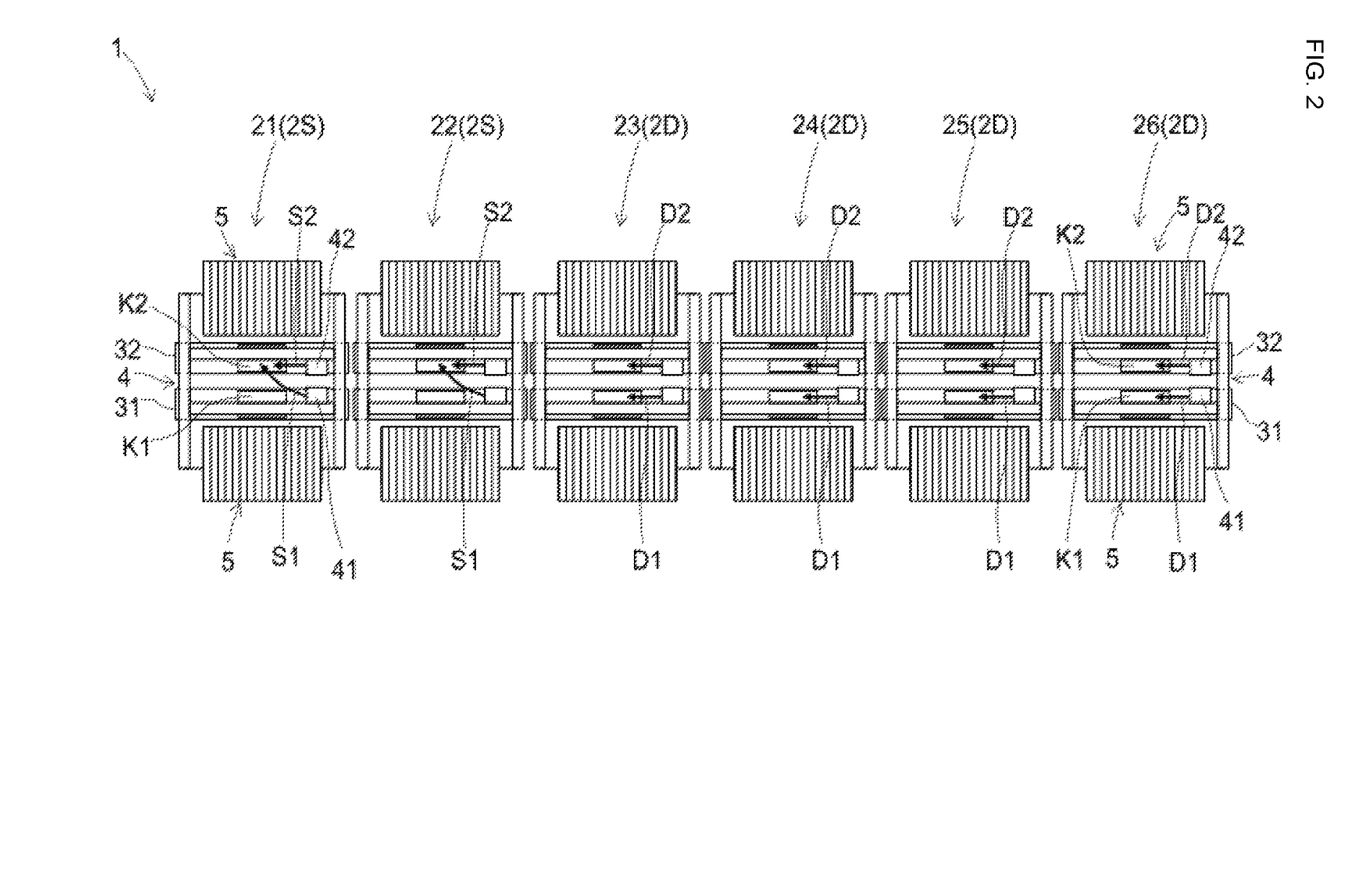
FIG. 2 shows an example of conditions set by a control section in which six component mounters are allocated as independent production mounters and second lane dedicated mounters using the embodiment of an electronic component mounting method.

Next, an example of results from the control section using the electronic component mounting method of the present embodiment is described. FIG. 2 shows an example of conditions set by the control section in which six components mounters 21 to 26 are allocated as independent production mounters 2D and second lane dedicated mounters 2S using the embodiment of an electronic component mounting method. In FIG. 2, first board K1 to be produced at first conveyance lane 31 is the bottom surface of a double-sided board, and second board K2 to be produced at second conveyance lane 32 is the top surface of the same double-sided board. For the double-sided board, mounting is performed by conveying the board once each through first conveyance lane 31 and second conveyance lane 32, the order being unimportant.

As shown in FIG. 2, the first and second mounters from the upstream side of component mounting system 1, component mounters 21 and 22, are allocated as second lane dedicated mounters 2S. As shown by arrows S1 and S2, with second lane dedicated mounters 2S, electronic components are mounted on second board K2 using first mounting head 41 and second mounting head 42. Also, the third to sixth mounters from the upstream side, component mounters 23 to 26 are allocated as independent production mounters 2D. With independent production mounters 2D, as shown by arrow D1, electronic components are mounted on first board K1 using first mounting head 41, and, as shown by arrow D2, electronic components are mounted on second board K2 using second mounting head 42.

Figure 3:
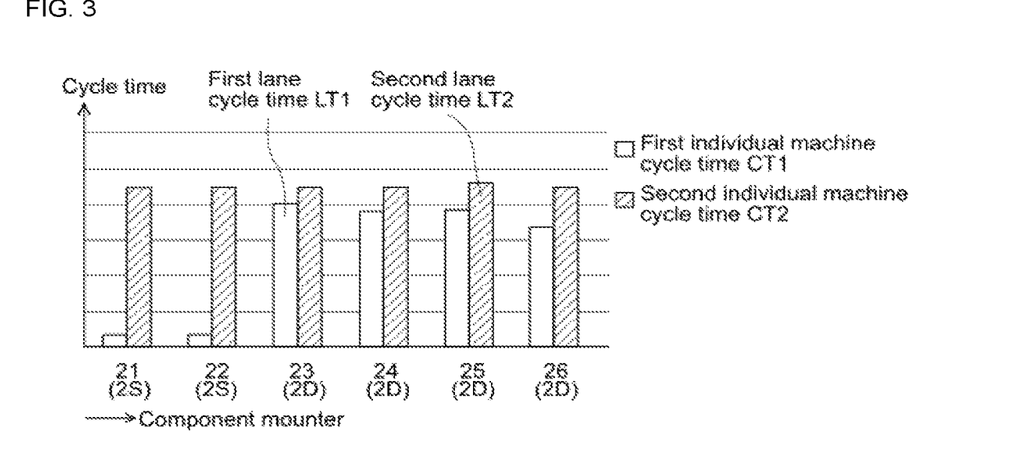
FIG. 3 is a bar chart showing cycle times for first individual machines and second individual machines when producing the bottom surface and the top surface of a double-sided board as a first board and a second board under the setting conditions shown in FIG. 2.

FIG. 3 is a bar chart showing cycle times CT1 and CT2 for first individual machines and second individual machines when producing the bottom surface and the top surface of a double-sided board as a first board K1 and a second board K2 under the setting conditions shown in FIG. 2. In FIG. 3, first individual machine cycle time CT1 is shown by a white bar, and second individual machine cycle time CT2 is shown by a shaded bar. As shown in the figure, first individual machine cycle times CT1 for each independent production mounter 2D (23 to 26) are largely balanced. However, the small first individual machine cycle time CT1 shown for second lane dedicated mounters 2S (21 and 22) represents the pass-through conveyance time of first board K1. The maximum value for first individual machine cycle time CT1 occurs for the third component mounter 23. This value is taken as first lane cycle time LT1. Conveyance timing for conveying first board K1 downstream in order in first conveyance lane 31 is determined based on first lane cycle time LT1, thus determining the production speed of first board K1.

On the other hand, second individual cycle times CT2 of each of the six component mounters 21 to 26 are largely balanced. The maximum value for second individual machine cycle time CT2 occurs for the fifth component mounter 25. This value is taken as second lane cycle time LT2. Conveyance timing for conveying second board K2 downstream in order in second conveyance lane 32 is determined based on second lane cycle time LT2, thus determining the production speed of second board K2.

Further, first lane cycle time LT1 and second lane cycle time LT2 are approximately the same. This means that the bottom surface and the top surface of the double-sided board are produced at approximately the same production speed.

Figure 4:
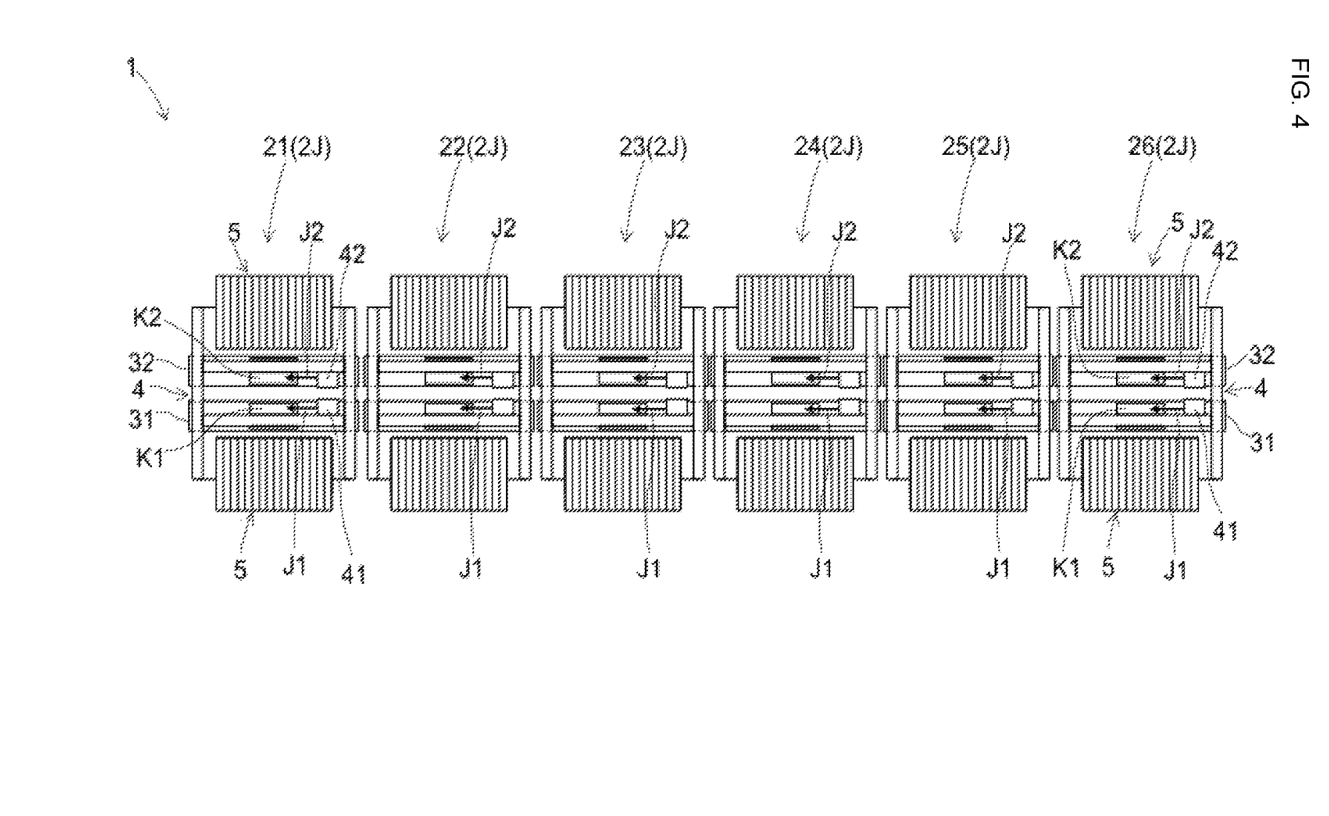
FIG. 4 shows an example of production conditions for a double-sided board when all six component mounters are set to be independent production mounters using a conventional independent production method.

Described next is a comparison of the results of the electronic component mounting method of the present embodiment and a method based on a conventional independent production method. FIG. 4 shows an example of production conditions for a double-sided board when all six component mounters 21 to 26 are set to be independent production mounters 2J using a conventional independent production method. With the conventional independent production method, with all of the component mounters 21 to 26, as shown by arrow J1, electronic components are mounted on first board K1 using first mounting head 41. Also, with all of the component mounters 21 to 26, as shown by arrow J2, electronic components are mounted on second board K2 using second mounting head 42.

Figure 5:
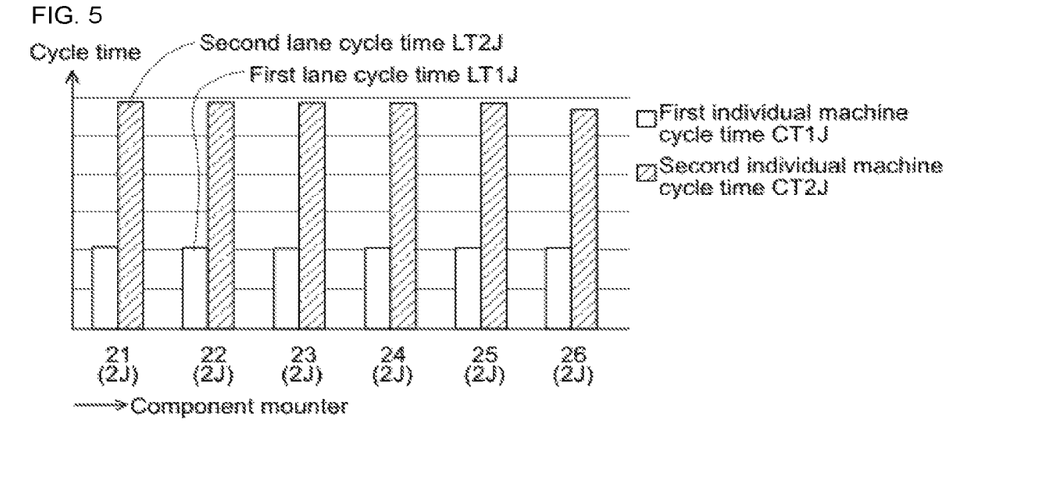
FIG. 5 is a bar chart showing cycle times for first individual machines and second individual machines when producing the bottom surface and the top surface of a double-sided board as a first board and a second board under the setting conditions using a conventional independent production method shown in FIG. 4.

Also, FIG. 5 is a bar chart showing cycle times CT1J and CT2J for first individual machines and second individual machines when producing the bottom surface and the top surface of a double-sided board as a first board K1 and a second board K2 under the setting conditions using the conventional independent production method shown in FIG. 4. In FIG. 5, first individual machine cycle time CT1J is shown by a white bar, and second individual machine cycle time CT2J is shown by a shaded bar. As shown in the figure, first individual machine cycle times CT1J of all of the mounters are largely balanced. The maximum value for first individual machine cycle time CT1J occurs for the second component mounter 22. This value is taken as first lane cycle time LT1J. Also, second individual machine cycle times CT2J of all of the mounters are largely balanced. The maximum value for first individual machine cycle time CT2J occurs for the first component mounter 21. This value is taken as second lane cycle time LT2J.

With the conventional independent production method, first lane cycle time LT1J is substantially smaller than second lane cycle time LT2J. This means that there is a large difference in the production speed of the bottom surface and the production speed of the top surface of the double-sided board. Also, first conveyance lane 31 and first mounting head 41 are idle for a time corresponding to second lane cycle time LT2J minus first lane cycle time LT1J.

Further, as understood from comparing FIGS. 3 and 5, second lane cycle time LT2 using the present embodiment is reduced by around 30% compared to second lane cycle time LT2J using the conventional independent production method. That is, according to the electronic component mounting method of the present embodiment, the time required for production of the double-sided board is reduced by around 30%.

Figure 6:
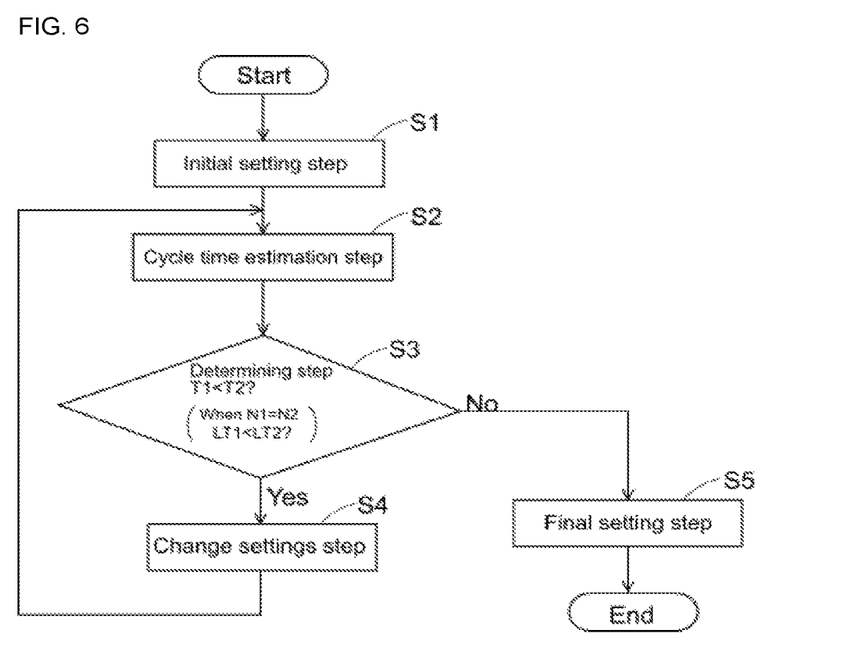
FIG. 6 is a flowchart showing the flow for calculating the allocation by the control section of the six component mounters into independent production mounters and second lane dedicated mounters.

Next, the specific method of appropriately allocating the six component mounters 21 to 26 as independent production mounters 2D and second lane dedicated mounters 2S is described using the above double-sided board as an example. The control section estimates first production required time T1 and second production required time T2 based on estimation conditions of the six component mounters 21 to 26 provisionally allocated as independent production mounters 2D and second lane dedicated mounters 2S; the control section then actually allocates the six component mounters 21 to 26 as independent production mounters 2D and second lane dedicated mounters 2S based on the estimation results. A representative example of an estimation calculating method that corresponds to so-called simulation as outlined above is described below. FIG. 6 is a flowchart showing the flow for calculating the allocation by the control section of the six component mounters 21 to 26 as independent production mounters 2D and second lane dedicated mounters 2S. The calculating flow performed by the control section includes initial setting step S1, cycle time estimation step S2, determining step S3, change settings step S4, and final setting step S5.

In initial setting step S1, the control section assumes initial estimation conditions in which all six component mounters 21 to 26 are all provisionally set as independent production mounters 2D. This is similar to a setting condition of the conventional independent production method shown as an example in FIG. 4.

Next, in cycle time estimation step S2, the control section allocates a first set of electronic components to first mounting heads 41 of independent production mounters 2D at that point, then estimates first individual machine cycle time CT1 required for mounting onto first board K1 at each independent production mounter 2D. Also, the control section takes the maximum value of first individual machine cycle time CT1 as first lane cycle time LT1. Similarly, the control section allocates a second set of electronic components to second mounting head 42 of independent production mounters 2D at that point and to first mounting head 41 and second mounting head 42 of second lane dedicated mounters 2S at that point, then estimates the second individual machine cycle times CT2 required each for mounting by the multiple component mounters 21 to 26 onto the second board. Further, the control section takes the maximum value of second individual machine cycle time CT2 as second lane cycle time LT2.

Here, the control section appropriately allocates the first set of electronic components such that the first individual cycle times CT1 of each independent production mounter 2D are largely balanced. Similarly, the control section appropriately allocates the second set of electronic components such that the second individual cycle times CT2 of all six of the component mounters 21 to 26 are largely balanced. Various known technology can be applied for a method of appropriately allocating many electronic components to be mounted to multiple mounting heads of multiple component mounters. For example, there are simple methods that allocate each component mounter 21 to 26 so as to optimize only the types of electronic components and mounting quantity of electronic components; or there are more subtle methods that perform optimization considering the arrangement order of tape-type feeders 51 in component supply device 5 and the mounting order of the electronic components.

Continuing from initial setting step S1, in the first cycle time estimation step S2, at that point second lane dedicated mounters 2S have not been set. Thus, the control section is able to acquire values corresponding to first and second individual machine cycle times CT1J and CT2J, and first and second lane cycle times LT1J and LT2J by the conventional independent production method shown in FIG. 5.

Next, in determining step S3, the control section determines whether first production required time T1 calculated by multiplying first lane cycle time LT1J by first production quantity N1 and second production required time T2 calculated by multiplying second lane cycle time LT2J by second production quantity N2 are approximately the same. However, because for production of the double-sided board, first production quantity N1 and second production quantity N2 are the same, the control section may determine whether first lane cycle time LT1J and second lane cycle time LT2J are approximately the same.

In the first determining step S3, first lane cycle time LT1J is substantially smaller than second lane cycle time LT2J; in other words, first production required time T1 is smaller than second production required time T2. In this case, the control section proceeds to change settings step S4.

In change settings step S4, the control section performs setting changes to the allocation of one of the independent production mounters 2D at that point to a second lane dedicated mounter 2S, thus changing the estimation conditions, and then returns to cycle time estimation step S2. At this time, it does not matter which independent production mounter 2D is selected by the control section to be allocated as a second lane dedicated mounter 2S. However, depending on the effectiveness of the selection method, there is a possibility that a difference may arise between the final first and second production required times T1 and T2. Here, the control section, from the independent production mounters 2D at that point, selects the component mounter with the largest second individual machine cycle time CT2 to be allocated as a second lane dedicated mounter 2S. That is, the independent production mounter 2D hindering the shortening of second lane cycle time LT2 is allocated as a second lane dedicated mounter 2S with priority. Accordingly, the independent production mounter 2D which is the bottleneck of second production required time T2 is able to be resolved.

In the first change settings step S4, because all of the multiple component mounters 21 to 26 are set as independent production mounters 2D, the control section may select any of component mounters 21 to 26 to be allocated as a second lane dedicated mounter 2S. However, the control section, in order to resolve the independent production mounter that is the bottleneck, allocates the first component mounter 21 (refer to FIG. 5), which has the largest second individual machine cycle time CT2, as a second lane dedicated mounter 2S.

Note that, for the selection criteria for the component mounter to be allocated as a second lane dedicated mounter 2S, there are two methods, separate method 1 and separate method 2. With separate method 1, the control section, from the independent production mounters 2D at that point, allocates a component mounter that includes a second mounting head 42 to which many components are allocated as a second lane dedicated mounter 2S. With separate method 2, the control section performs a simulation to select the component mounter to allocated as a second lane dedicated mounter 2S. As described above, the control section, first, supposes for all cases of allocating any one of the independent production mounters 2D at that point as a second lane dedicated mounter 2S. Next, the control section, for each case, estimates each second lane cycle time LT2 using the same method as in cycle time estimating step S2. Thirdly, the control section actually allocates the independent production mounter 2D for which the second lane cycle time LT2 is minimized as a second lane dedicated mounter 2S.

In the first change settings step S4, the control section changes estimation conditions by allocating the first component mounter 21 as a second lane dedicated mounter 2S, and then returns to cycle time estimation step S2. Thereafter, the control section repeats cycle time estimation step S2, determining step S3, and change settings step S4 until first production required time T1 and second production required time T2 are approximately the same. With production of a double-sided board, the control section may repeat each step S2 to S4 until first lane cycle time LT1J becomes larger than or approximately the same as second lane cycle time LT2J.

Although not shown in the figure, for the second occurrence of determining step S3 after cycle time estimation step S2, first production required time T1 is still smaller than second production required time T2. Therefore, in the second change settings step S4, the control section, from the second to sixth component mounters 22 to 26 set as independent production mounters 2D, changes estimation conditions by allocating the second component mounter 22 as a second lane dedicated mounter 2S. Then, the control section returns to perform cycle time estimation step S2 for a third time.

In the third cycle time estimation step S2, the control section is able to achieve values corresponding to the first and second individual machine cycle times CT1 and CT2, and the first and second lane cycle times LT1 and LT2 shown in FIG. 3. After that, in the third determining step S3, because the first lane cycle time LT1 and the second lane cycle time LT2 are approximately the same, the control section proceeds to final setting step S5.

In final setting step S5, the control section actually allocates the six component mounters 21 to 26 as independent production mounters 2D and second lane dedicated mounters 2S based on the estimation conditions at that point. Specifically, the control section, as per the setting changes in the first and second change setting steps S4, finally sets first and second component mounters 21 and 22 as second lane dedicated mounters 2S. Also, the control section finally sets the third to sixth component mounters 23 to 26, for which settings were not changed, as independent production mounters 2D. In this way, the control section appropriately allocates the six component mounters 21 to 26 as independent production mounters 2D and second lane dedicated mounters 2S.

The electronic component mounting method of the present embodiment includes setting a portion of multiple electronic component mounters 21 to 26 as independent production mounters 2D and the remaining portion of the multiple electronic component mounters 21 to 26 as second lane dedicated mounters 2S; allocating mounting of a first set of electronic components on a first board K1 to first mounting head 41 of independent production mounters 2D; and allocating mounting of a second set of electronic components on a second board K2 to second mounting head 42 of the independent production mounters 2D and to first mounting head 41 and second mounting head 42 of second lane dedicated mounters 2S, the electronic component mounting method being a method in which at least one of the component quantity or the component types are different for the first set of electronic components to be mounted on the first board K1 and the second set of electronic components to be mounted on the second board K2, and using an electronic component mounting system in which multiple component mounters 21 to 26 are arranged in series with respective first conveyance lanes 31 of the component mounters connected in series and respective second conveyance lanes 32 of the component mounters connected in series, the component mounters being equipped with board conveyance device 3 having first conveyance lane 31 that loads and unloads first board K1 and second conveyance lane 32 that loads and unloads a second board K2, and board transfer device 4 having first mounting head 41, provided adjacent to first conveyance lane 31, that is capable of movement and of mounting electronic components on first board K1 loaded on first conveyance lane 31 and of mounting electronic components on second board K2 loaded on second conveyance lane 32, and second mounting head 42, provided adjacent to second conveyance lane 32, that is capable of movement and of mounting electronic components on first board K1 loaded on first conveyance lane 31 and of mounting electronic components on second board K2 loaded on second conveyance lane 32.

According to this, considering the component quantities and production quantities of two types of boards, first board K1 for which the mounting load is light is produced at first conveyance lane 31, and second board K2 for which the mounting load is heavy is produced at second conveyance lane 32. Also, mounting of a first set of electronic components on first board K1 for which the mounting load is light is allocated to first mounting heads 41 of the independent production mounters 2D, and mounting of a second set of electronic components on second board K2 for which the mounting load is heavy is allocated to second mounting heads 42 of the independent production mounters 2D and to first mounting heads 41 and second mounting heads 42 of the second lane dedicated mounters 2D.

In other words, mounting for first board K1 for which the mounting load is light is allocated to first mounting heads 41 of only a portion, 23 to 26, of the six component mounters 21 to 26. Conversely, mounting for second board K2 for which the mounting load is heavy is allocated to first mounting heads 31 of the remaining portion, 21 and 22, of the six component mounters, and to second mounting heads 42 of all of the component mounters 21 to 26. Also, because the production speeds of first conveyance lane 31 and second conveyance lane 32 may be different, the present disclosure can be considered as an improved independent production method. With the present embodiment, at least one of first mounting heads 41 on the first conveyance lane 31 side for which there is tendency for idle time to occur with conventional independent conveyance methods is allocated to second conveyance lane 32, thus the mounting load is allocated evenly across all mounting heads 41 and 42. By this, the idle time of mounting heads 41 and 42 is reduced, improving the operating rate, meaning that panels are produced efficiently by electronic component mounting system 1.

Further, the electronic component mounting method of the present embodiment allocates the six component mounters 21 to 26 as independent production mounters 2D and second lane dedicated mounters 2S such that first production required time T1 that is an estimate of the time required to produce first production quantity N1 of first board K1 and second production required time T2 that is an estimate of the time required to produce second production quantity N2 of second board K2 are approximately the same, wherein first production quantity N1, which is the quantity of first board K1 to be produced, and second production quantity N2, which is the quantity of second board K2 to be produced, are predetermined.

Accordingly, because first production required time T1 and second production required time T2 are approximately the same, the idle time of mounting heads 41 and 42 is greatly reduced, greatly improving the operating rate, and allowing boards to be produced with an entirely higher level of efficiency.

Further, with the electronic component mounting method of the present embodiment, first production required time T1 and second production required time T2 are estimated based on estimation conditions of the six component mounters 21 to 26 provisionally allocated as independent production mounters 2D and second lane dedicated mounters 2S; and then the six component mounters 21 to 26 are actually allocated as independent production mounters 2D and second lane dedicated mounters 2S based on the estimation results.

Accordingly, it is possible to actually allocate the six component mounters 21 to 26 as independent production mounters 2S and second lane dedicated mounters 2S by performing estimation equivalent to a so-called simulation. Thus, the electronic component mounting method of the present embodiment is more reliable than a method that relies on experience or intuition, and reliably allows boards to be produced efficiently.

Further, the electronic component mounting method of the present embodiment includes initial setting step S1 of deciding initial estimation conditions by provisionally setting all six component mounters 21 to 26 as independent production mounters 2D, cycle time estimating step S2 of allocating the first set of electronic components to first mounting head 41 of independent production mounters 2D at that point, estimating first individual machine cycle time CT1 that is the time required for mounting onto first board K1 for each of independent production mounters 2D, then taking the largest value of first individual machine cycle time CT1 as first lane cycle time LT1, allocating the second set of electronic components to second mounting head 42 of independent production mounters 2D at that point and to first mounting head 41 and second mounting head 42 of second lane dedicated mounters 2S at that point, estimating second individual machine cycle time CT2 that is the time required for mounting onto second board K2 for each of the six component mounters 21 to 26, and then taking the largest value of second individual machine cycle time CT2 as second lane cycle time LT2, determining step S3 of determining whether first production required time T1 obtained by multiplying first lane cycle time LT2 by first production quantity N1, and second production required time T2 obtained by multiplying second lane cycle time CT2 by second production quantity N2 are approximately the same, change settings step S4 that, while first production required time T1 is smaller than second production required time T2 in determining step S3, changes the estimation conditions by changing settings so as to allocate one of the independent production mounters 2D at that point as a second lane dedicated mounter 2S, and a final setting step that, when first production required time T1 in determining step S3 becomes larger than or approximately the same as second production required time T2, actually allocates the six multiple component mounters 21 to 26 as the independent production mounters 2D and the second lane dedicated mounters 2S based on the estimation conditions at that point.

Accordingly, because second lane dedicated mounters 2S are increased one by one, a subtle simulation with high reliability is performed, and boards are reliably able to be produced efficiently.

Further, with the electronic component mounting method of the present embodiment, in cycle time estimation step S2, the first set of electronic components are appropriately allocated to first mounting heads 41 of the independent component mounters 2D at that point such that first individual machine cycle times CT1 of each of the independent component mounters 2D approximately balance, and the second set of electronic components are appropriately allocated to second mounting heads 42 of the independent component mounters 2D at that point and to first mounting heads 41 and second mounting head 42 of the second lane dedicated mounters 2S at that point such that second individual machine cycle times CT2 of each of the six component mounters 21 to 26 approximately balance.

Accordingly, because electronic components are appropriately allocated to all the mounting heads 41 and 42, first and second conveyance lines 31 and 32, and first and second mounting heads 41 and 42 largely do not become idle. Thus, the operating rate is greatly improved and boards are able to be produced with an entirely higher level of efficiency.

Further, with the electronic component mounting method of the present embodiment, in change settings step S4, the component mounter with the largest second individual machine cycle time CT2 from among the independent production mounters 2D at that point, or the component mounter for which second mounting head 42 has the largest quantity of components allocated from among the independent production mounters 2D at that point, is allocated as a second lane dedicated mounter 2S.

Accordingly, the independent production mounter 2D hindering the shortening of second lane cycle time LT2 is allocated as a second lane dedicated mounter 2S with priority, allowing the independent production mounter 2D that is the bottleneck of second production required time T2 to be resolved. Thus, the load is evenly spread between each of the six component mounters 21 to 26, meaning that boards are able to be produced with an entirely higher level of efficiency.

Also, with the electronic component mounting method of the present embodiment, in change settings step S4, calculations are performed for all cases of allocating any one of the independent production mounters 2D at that point as a second lane dedicate mounter 2S, and for each case, using the same method as cycle time estimation step S2, each second lane cycle time LT2 is estimated, and the independent production mounter 2D for which second lane cycle time LT2 is smallest is actually allocated as a second lane dedicated mounter 2S.

Accordingly, because a simulation is performed for all cases of allocating any one of the independent production mounters 2D at that point as a second lane dedicated mounter 2S, the load is reliably spread evenly between the six component mounters 21 to 26. Thus, boards are reliably able to be produced with an entirely higher level of efficiency.

Further, in the electronic component mounting method of the present embodiment, first board K1 is the bottom surface of a double-sided board, and second board K2 is the top surface of the double-sided board.

That is, according to the electronic component mounting method of the present embodiment, a remarkable effect is seen when producing double-sided boards. That is, idle time is virtually eliminated for first and second conveyance lanes 31 and 32, and for first and second mounting heads 41 and 42, and the bottom surface and top surface of a double-sided board can be produced in approximately the same production required time.

Electronic component mounting system 1 of the present embodiment includes: six component mounters 21 to 26 arranged in series with respective first conveyance lanes 31 of the component mounters connected in series and respective second conveyance lanes 32 of the component mounters connected in series, the component mounters being equipped with board conveyance device 3 having first conveyance lane 31 that loads and unloads first board K1 and second conveyance lane 32 that loads and unloads second board K2, and board transfer device 4 having first mounting head 41, provided adjacent to first conveyance lane 31, that is capable of movement and of mounting electronic components on first board K1 loaded on first conveyance lane K1 and of mounting electronic components on second board K2 loaded on second conveyance lane K2, and second mounting head 42, provided adjacent to second conveyance lane 32, that is capable of movement and of mounting electronic components on first board K1 loaded on first conveyance lane 31 and of mounting electronic components on second board K2 loaded on second conveyance lane 32, wherein electronic component mounting system 1, when at least one of the component quantity or the component types are different for the first set of electronic components to be mounted on first board K1 and the second set of electronic components to be mounted on second board K2, sets a portion, 23 to 26, of the six electronic component mounters 21 to 26 as independent production mounters 2D and the remaining portion of the six electronic component mounters as second lane dedicated mounters 2S, allocates mounting of the first set of electronic components on first board K1 to first mounting heads 41 of the independent production mounters 2D; and allocates mounting of the second set of electronic components on second board K2 to second mounting heads 42 of independent production mounters 2D and to first mounting heads 41 and second mounting heads 42 of second lane dedicated mounters 2S.

Accordingly, the present disclosure may be applied as electronic component mounting system 1. The effects of an embodiment of electronic component mounting system 1 are the same as the effects of the electronic component mounting method of the first embodiment.

Note that, in the third determining step S3 of the calculating flow of the control section shown in FIG. 6, the control section may proceed to change settings step S4 again without proceeding to final setting step S5. In this case, the control section, from the component mounters 23 to 26 set as independent production mounters 2D at that point, that is, the third to the sixth component mounter, the component mounter with the largest second individual machine cycle time CT2, that is the fifth component mounter 25 (refer to FIG. 3) is allocated as a second lane dedicated mounter 2S. By this, settings are changed such that the first, second, and fifth component mounters, that is, 21, 22, and 25, are set as second lane dedicated mounters, while the other component mounters, that is, 23, 24, and 26, remain as independent production mounters 2D. Then, in the fourth cycle time estimation step S2, the control section may grasp that the first lane cycle time LT1 is now larger than the second lane cycle time LT2, thus reversing their size relationship. By this, the control section proceeds to final setting step S5 from the fourth determining step S3. Also, in final setting step S5, the control section may compare a case of two second lane dedicated mounters 2S (as shown in FIGS. 3 and 4) and a case of three second lane dedicated mounters 2S, and then make a final determination.

Note also that the calculation flow of the control section shown in FIG. 6 may be modified or applied in various ways. For example, a simulation may be performed for every allocation of the six component mounters 21 to 26 as independent production mounters 2D and second lane dedicated mounters 2S. Specifically, because each component mounter 21 to 26 could be either an independent production mounter 2D or a second lane dedicated mounter 2S, simulations may be performed two to the power of six times, that is, sixty-four times. Although calculation processing time for this method is long, an optimal allocation is certain to be achieved.

Also, it is also possible to set a specified desired time ratio instead of making first production required time T1 and second production required time T2 approximately equal. That is, the six component mounters 21 to 26 may be appropriately allocated as independent production mounters 2D and second lane dedicated mounters 2S to achieve the time ratio. Accordingly, first and second conveyance lanes with a production performance ratio (mounting work performance ratio) in accordance with the time ratio is achieved. Various other applications and modifications are possible for the present disclosure.

REFERENCE SIGNS LIST

1: electronic component mounting system; 21 to 26: component mounter; 2D: independent production mounter; 2S: second lane dedicated mounter; 2J: conventional independent production mounter; 3: board conveyance device; 31: first conveyance lane; 32: second conveyance lane; 4: component transfer device; 41: first mounting head; 42: second mounting head; 5: component supply device; 51: tape-type feeder; 6: system control section; 7: host computer; 9: base; K1: first board; K2: second board.

The invention claimed is:

1. An electronic component mounting method comprising:

setting a portion of electronic component mounters as independent production mounters and a remaining portion of the electronic component mounters as second lane dedicated mounters;

deciding initial estimation conditions by provisionally setting all the electronic component mounters as the independent production mounters;

allocating mounting of a first set of electronic components on a first board to a first mounting head of one of the independent production mounters;

allocating mounting of a second set of electronic components on a second board to a second mounting head of the one of the independent production mounters and to a first mounting head and a second mounting head of one of the second lane dedicated mounters, the electronic component mounting method being a method in which at least one of a component quantity or component types are different for the first set of electronic components to be mounted on the first board and the second set of electronic components to be mounted on the second board, and using an electronic component mounting system in which the electronic component mounters are arranged in series with respective first conveyance lanes of the electronic component mounters connected in series and respective second conveyance lanes of the electronic component mounters connected in series, the electronic component mounters each including a board conveyance device including the first conveyance lane that loads and unloads the first board and the second conveyance lane that loads and unloads the second board, the first mounting head, provided adjacent to the first conveyance lane, configured to mount the first set of electronic components on the first board loaded on the first conveyance lane and to mount the second set of electronic components on the second board loaded on the second conveyance lane, and the second mounting head, provided adjacent to the second conveyance lane, configured to mount the first set of electronic components on the first board loaded on the first conveyance lane and to mount the second set of electronic components on the second board loaded on the second conveyance lane;

determining whether a first production required time obtained by multiplying a first lane cycle time by a first production quantity, and a second production required time obtained by multiplying a second lane cycle time by a second production quantity are approximately the same, while the first production required time is smaller than the second production required time, changing the initial estimation conditions to a changed estimation condition by changing settings so as to allocate one of the independent production mounters at that point as the second lane dedicated mounter; and when the first production required time becomes larger than or substantially the same as the second production required time, allocates the multiple component mounters as the independent production mounters and the second lane dedicated mounters based on the changed estimation conditions.

2. The electronic component mounting method according to claim 1, further including allocating the electronic component mounters as the independent production mounters and the second lane dedicated mounters such that the first production required time that is an estimate of a time required to produce a first production quantity of the first board and the second production required time that is an estimate of a time required to produce a second production quantity of the second board are substantially the same, wherein the first production quantity, which is a quantity of the first board to be produced, and the second production quantity, which is a quantity of the second board to be produced, are predetermined.

3. The electronic component mounting method according to claim 1, further including a cycle time estimating step of allocating the first set of electronic components to the first mounting heads of the independent production mounters at that point, estimating a first individual machine cycle time that is a time required for mounting onto the first board for each of the independent production mounters, then taking a largest value of the first individual machine cycle time as a first lane cycle time, allocating the second set of electronic components to the second mounting heads of the independent production mounters at that point and to the first mounting heads and the second mounting heads of the second lane dedicated mounters at that point, estimating a second individual machine cycle time that is a time required for mounting onto the second board for each of the electronic component mounters, and then taking a largest value of the second individual machine cycle time as a second lane cycle time.

4. The electronic component mounting method according to claim 3, wherein in the cycle time estimation step, the first set of electronic components are appropriately allocated to the first mounting heads of the independent component mounters at that point such that the first individual machine cycle times of each of the independent component mounters approximately balances, and the second set of electronic components are appropriately allocated to the second mounting heads of the independent component mounters at that point and to the first mounting heads and the second mounting heads of the second lane dedicated mounters at that point such that the second individual machine cycle times of each of the multiple component mounters approximately balances.

5. The electronic component mounting method according to claim 3, wherein the electronic component mounter with the largest value of the second individual machine cycle time from among the independent production mounters at that point, or the electronic component mounter for which the second mounting head has a largest value of quantity of the electronic components allocated from among the independent production mounters at that point, is allocated as the second lane dedicated mounter.

6. The electronic component mounting method according to claim 1, wherein the first board is a bottom surface of a double-sided board, and the second board is a top surface of the double-sided board.

* * * * *